United States Patent [19]

Wislocky

[11] 4,070,688
[45] Jan. 24, 1978

[54] FLEXIBLE LEAD

[75] Inventor: Joseph Wislocky, El Segundo, Calif.

[73] Assignee: International Rectifier Corporation, Los Angeles, Calif.

[21] Appl. No.: 754,164

[22] Filed: Dec. 27, 1976

[51] Int. Cl.² .................... H01L 23/48; H01L 23/02; H01L 23/42
[52] U.S. Cl. ........................................ 357/68; 357/74; 357/79
[58] Field of Search .............................. 357/68, 74, 79

[56] References Cited

U.S. PATENT DOCUMENTS

| | | | |
|---|---|---|---|
| 3,428,871 | 2/1969 | Scott et al. | 357/68 |
| 3,449,642 | 6/1969 | Ortner et al. | 357/68 |
| 3,723,836 | 3/1973 | Shekerjian et al. | 357/74 |

*Primary Examiner*—Edward J. Wojciechowicz
*Attorney, Agent, or Firm*—Ostrolenk, Faber, Gerb & Soffen

[57] ABSTRACT

First and second electrodes are formed on opposite sides of a relatively fragile, thin, flat wafer of a semiconductor material having at least one p-n junction. The first and second terminals extend externally of the housing in which the semi-conductor wafer is enclosed. The second terminal is electrically connected to the second electrode. A flexible lead connects the first terminal to the first electrode. The flexible lead includes an elongated conductive member having at least two reentrantly bent flexible legs which have their ends spaced from one another. The flexible lead further includes an elongated lead extending perpendicular from a central region of the elongated conductive member in a direction opposite from the direction in which the flexible legs extend. The outer surfaces of the at least two legs are electrically and mechanically connected to the first electrode.

9 Claims, 8 Drawing Figures

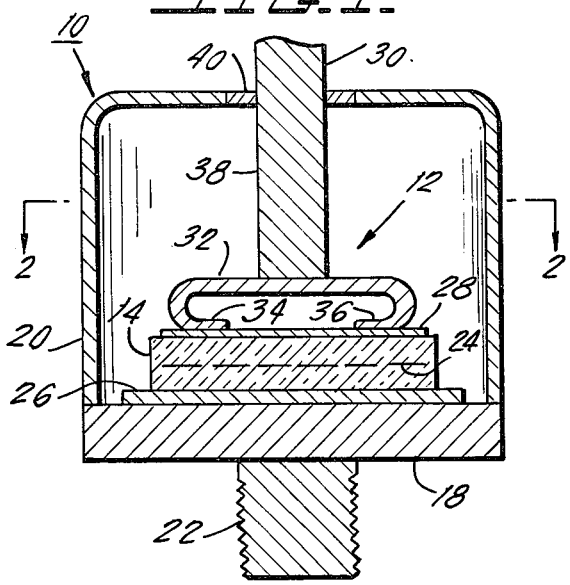
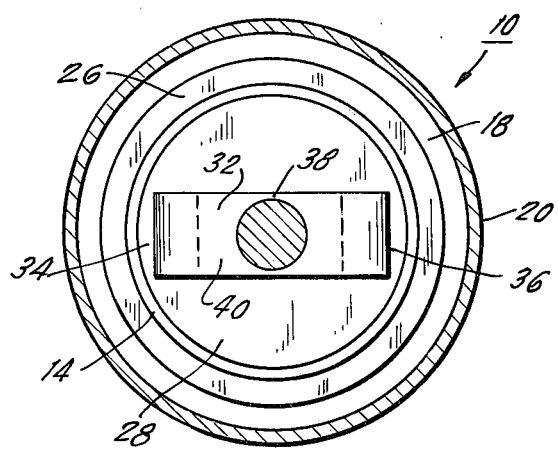
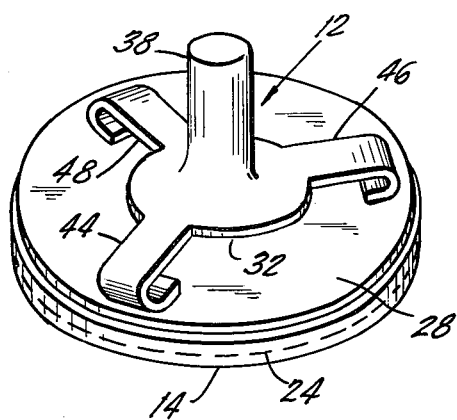
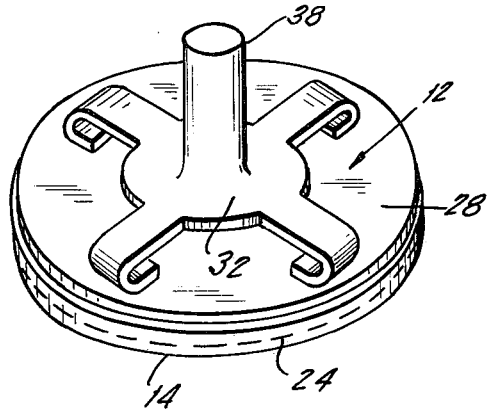
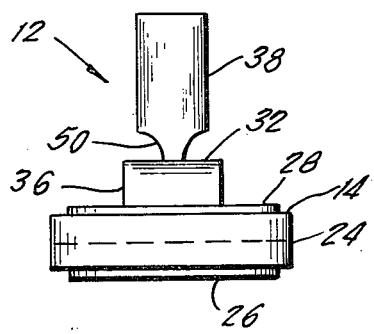
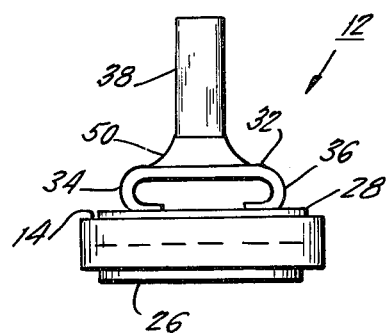

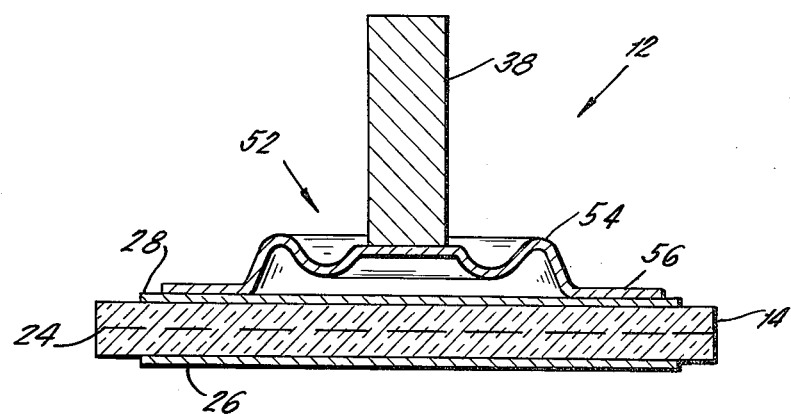
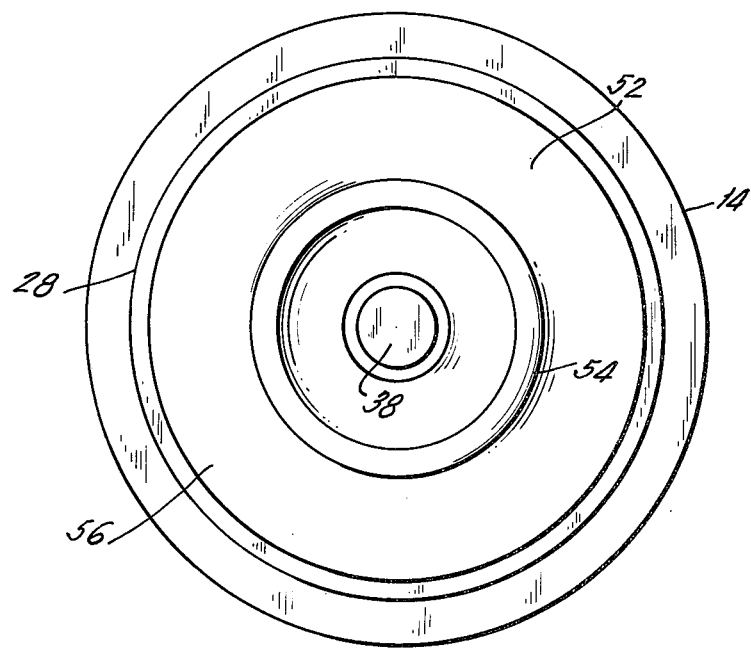

FLEXIBLE LEAD

BACKGROUND OF THE INVENTION

The present invention relates to semi-conductor devices and, more particularly, to a flexible lead structure for semi-conductor devices.

Semi-conductor wafers such as thin mono-crystalline silicon wafers used in semi-conductor devices are brittle and must be protected from the application of excessive forces during assembly and use of the semi-conductor device. A potential source of these forces is the lead bonded to the wafer. The lead will be subjected to various mechanical forces during assembly and operation of the device due to mechanical vibration and thermal expansion. Care must be taken to design the lead in such a manner that the transmission of these forces to the semi-conductor wafer is kept to a minimum.

A solution to this problem has been to include an expansion loop, such as a flexible C-shaped or S-shaped region, in the lead structure. Such leads are illustrated in U.S. Pat. No. 3,449,642, assigned to the assignee of the present invention.

While these devices have provided some degree of protection, they have been objectionable in at least one area. In order to maintain a low voltage drop and temperature rise, it is desirable to design the lead such that the cross-sectional area in the expansion loop is as least as great as the cross-sectional area of the remaining portions of the lead. In prior art devices, this has meant that the expansion loop must be comparatively thick to provide the necessary cross-sectional area. Additionally, since a single C-shaped or S-shaped bend was used, flexibility of the lead was largely limited to a single plane.

SUMMARY OF THE INVENTION

These and other deficiencies of the prior art devices are overcome by the present invention by the provision of a flexible lead including an elongated conductive member having at least two reentrantly bent flexible legs which have their ends spaced from one another, and an elongated lead extending perpendicular from a central region of the elongated conductive member in a direction opposite from the direction in which the flexible leads extend. The outer surfaces of the at least two reentrantly bent legs are both electrically and mechanically connected to an electrode formed on the semi-conductor wafer.

Another feature of the present invention which overcomes the deficiencies in the prior art is the provision of a restricted cross-sectional area at the junction of the elongated lead and the flexible legs to permit flexing at the restricted cross-section.

BRIEF DESCRIPTION OF THE DRAWINGS

For the purpose of illustrating the invention, there are shown in the drawings forms which are presently preferred; it being understood, however, that this invention is not limited to the precise arrangements of the instrumentalities shown.

FIG. 1 is a cross-sectional view of a flexible lead assembly constructed in accordance with the principles of the present invention.

FIG. 2 is a cross-sectional view of the flexible lead assembly of FIG. 1 taken along lines 2—2 of FIG. 1.

FIG. 3 is a perspective view of a lead assembly comprising a second embodiment of the present invention.

FIG. 4 is a perspective view of the lead assembly comprising a third embodiment of the present invention.

FIGS. 5 and 6 are front and side views, respectively, of a lead assembly comprising a fourth embodiment of the present invention.

FIG. 7 is a cross-sectional view of a lead assembly comprising a fifth embodiment of the present invention.

FIG. 8 is a top view of the lead assembly of FIG. 7.

DETAILED DESCRIPTION OF THE PREFERRED EMBODIMENTS

Referring now to the drawings where like numerals indicate like elements, there is shown in FIGS. 1 and 2 a lead assembly constructed in accordance with the principles of the present invention, and designated generally as 10. Lead assembly 10 includes a flexible lead 12 and a semi-conductor wafer 14 enclosed within a protective housing 16. Housing 16 comprises a conductive base 18 and a protective casing 20. A conductive threaded stud 22 depends from base 18 and is adapted to be screwably received by an appropriate threaded bore.

Semi-conductor wafer 14 is a relatively fragile, thin, wafer of a semi-conductor material having at least one p-n junction 24. Semi-conductor wafer 14 is electrically and mechanically connected to base 18 via electrode 26 which may comprise any conductive material deposited on base 18. Semi-conductor wafer 14 is electrically and mechanically connected to flexible lead 12 by an electrode 28 which comprises a conductive material deposited on wafer 14. Flexible lead 12 connects semi-conductor wafer 14 to external circuitry. Semi-conductor wafers of the type illustrated herein are brittle, and must be protected from the application of excessive forces during assembly and use of the semi-conductor device. Care must be taken to design lead 12 in such a manner that the various mechanical forces applied to the end 30 of lead 12 which extends the externally of housing 16 are not transmitted to the junction between lead 12 and semi-conductor wafer 14.

To this end, the present invention utilizes a flexible lead including an elongated conductive member 32 having first and second reentrantly bent flexible legs 34 and 36 and an elongated lead 38 extending perpendicular from a central region 40 of elongated member 32. The flexible lead 12 is insulated from the conductive protective casing 20 by an insulating bead 40. For reasons set forth in greater detail below, it is preferred that elongated member 32 and elongated lead 38 be formed separately and then welded, soldered or otherwise bonded together.

As noted above, it is desirable that the transverse cross-sectional area of elongated member 32 and elongated lead 38 are equal in order to maintain a low voltage drop and temperature rise. In prior art devices, this means that the thickness of the S or C-shaped section had to be relatively great. This limitation is overcome in the present invention by providing a plurality of reentrantly bent legs connecting the elongated lead 38 to the second electrode 28. In this manner, each leg provides an alternative parallel path for current flowing from lead 38 to semi-conductor wafer 14 and lessens the required current carrying capacity for each individual leg.

In the embodiment illustrated in FIGS. 1 and 2, legs 34 and 36 provide two parallel current paths in series with elongated lead 38. As a result, the current carrying capacity of each leg 34, 36 need only be one-half that of the elongated lead 38. Since the current carrying capacity of each leg 34, 36 is directly proportional to the transverse cross-sectional area of each leg, the required transverse cross-sectional area of each leg is also halved.

As a result of the reduction in the thickness of each leg of elongated conductive member 32, the lead assembly of the present invention is much more desirable than the lead assembly of the prior art device disclosed in U.S. Pat. No. 3,449,642. Since each leg of the elongated conductive member 32 is thinner than the flexible portions of the prior art leads, lead 12 is more flexible than the prior art leads. Additionally, since the distance between elongated lead 38 and semi-conductor wafer 14 may be reduced, the overall height of lead assembly 10 may be reduced.

The flexible lead 12 of the present invention may simply and inexpensively be produced using standard off-the-shelf conductive materials. Thus, elongated conductive member 32 may be stamped from a single flexible sheet of conductive material and legs 34, 36 may be formed by any suitable bending operation, such as by rolling. The elongated lead 38 may be formed of standard wire or other flexible material. The two sections may then be welded, soldered or otherwise secured together. Such a procedure produces an inexpensive, highly flexible lead 12 which may be advantageously utilized in lead assemblies of the type described herein.

Referring now to FIG. 3, there is shown a second embodiment of the present invention. In this embodiment, as well as in the embodiments shown in FIGS. 4–8, the housing 16 has not been shown for the sake of clarity. In the embodiment illustrated in FIG. 3, elongated conductive member 32 includes three reentrantly bent flexible legs 44–48. As a result, each leg 44–48 requires only one-third the current carrying capacity of the elongated lead 38 and the thickness of each leg 44–48 may be reduced in even greater amount than possible in the embodiment illustrated in FIGS. 1 and 2. As a result, the flexibility of lead 12 is further increased and the overall height of the lead assembly is further decreased. An additional advantage of this embodiment is that the flexibility of the lead 12 is not substantially limited to one vertical plane as is the case in the embodiment illustrated in FIGS. 1 and 2.

It should be obvious from the foregoing, that by increasing the number of legs of elongated conductive member 32, as shown in FIG. 4, the overall height of lead assembly 10 is further reduced and the flexibility of lead 12 is increased. The greater the number of legs, the greater the flexibility of the lead. The optimum case is that illustrated in FIGS. 7 and 8. In this embodiment, elongated conductive member 32 is replaced by a circular disc 52 which is provided with a plurality of bellows 54. The circular disc 52 is soldered or otherwise connected to electrode 28 at its flattened rim portion 56. Due to the concentric nature of disc 52, lead 12 is equally resilient in every vertical plane and provides excellent protection for semi-conductor wafer 14.

As noted above, in the embodiment illustrated in FIGS. 1 and 2 the flexibility of lead 12 is limited substantially to one plane. In those applications where greater flexibility if desired, a flexible neck portion 50 is formed in elongated lead 38. As seen in FIGS. 5 and 6, the dimensions of neck portions 50 are preferably tapered in order that the transverse cross-sectional area of neck portion 50 is approximately equal to the transverse cross-sectional area of elongated lead 38 throughout its axial length.

The present invention may be embodied in other specific forms without departing from the spirit or essential attributes thereof and, accordingly, reference should be made to the appended claims, rather than to the foregoing specification as indicating the scope of the invention.

What is claimed is:

1. A flexible lead for a semi-conductor device; said semi-conductor device comprising:
    a single, relatively fragile, thin, flat wafer of a semi-conductor material having at least one p-n junction;
    first and second electrodes on opposite surfaces of said semi-conductor wafer;
    a housing enclosing said semi-conductor wafer;
    first and second terminals extending externally of said housing; said second terminal being electrically connected to said second electrode;
    said flexible lead connecting said first terminal to said first electrode; said flexible lead including an elongated conductive member having a main body which has at least two reentrantly bent flexible legs extending from a flat body section and which are disposed in a common plane which is spaced from and parallel to said flat body section; said legs having ends which face one another and which are spaced from one another; said flexible lead having an elongated lead extending perpendicularly from a central region of said main body and extending in a direction opposite from the direction of said common plane, the outer surfaces of said at least two legs being electrically and mechanically connected to said first electrode.

2. A flexible lead assembly as in claim 1, wherein said elongated lead has a restricted cross-section at the juncture of said elongated lead and said flexible legs to permit flexing at said restricted cross-section.

3. A flexible lead assembly as in claim 1, wherein the combined transverse cross-sectional area of said flexible legs is approximately equal to the transverse cross-sectional area of said elongated lead.

4. A flexible lead assembly as in claim 1, wherein said elongated conductive member and said elongated lead are separate members which are soldered or otherwise joined together.

5. A flexible lead assembly as in claim 1, wherein said elongated conductive member has a circular cross-section.

6. A flexible lead assembly in accordance with claim 5, wherein each of said flexible legs has a rectangular cross section.

7. A flexible lead assembly as in claim 1, wherein said elongated conductive member has at least three reentrantly bent flexible legs which have their ends spaced from one another.

8. A flexible lead assembly for a semi-conductor device, comprising:
    a single, relatively fragile, thin, flat wafer of a semi-conductor material having at least one p-n junction;
    first and second electrodes on opposite surfaces of said semi-conductor wafer;
    a housing enclosing said semi-conductor wafer;
    first and second terminals extending externally of said housing; said second terminal being electrically connected to said second electrode;

a flexible lead connecting said first terminal to said first electrode; said flexible lead including a thin disc member having a rim portion disposed in a plane which is axially spaced from a cental region thereof; said flexible lead also having an elongated lead extending perpendicular from a central portion of said disc member in a direction away from said plane; said rim portion of said disc member being electrically and mechanically coupled to said first electrode.

9. A flexible lead assembly as in claim 8, wherein said disc member includes a plurality of concentric bellows interposed between said rim portion and said central portion.

* * * * *